(12) United States Patent
Bang et al.

(10) Patent No.: US 7,758,698 B2
(45) Date of Patent: *Jul. 20, 2010

(54) DUAL TOP GAS FEED THROUGH DISTRIBUTOR FOR HIGH DENSITY PLASMA CHAMBER

(75) Inventors: Won B. Bang, Gilroy, CA (US); Srivivas D. Nemani, Sunnyvale, CA (US); Phong Pham, San Jose, CA (US); Ellie Y. Yieh, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 813 days.

This patent is subject to a terminal disclaimer.

(21) Appl. No.: 11/564,122

(22) Filed: Nov. 28, 2006

(65) Prior Publication Data

US 2008/0121178 A1  May 29, 2008

(51) Int. Cl.
- C23C 16/455 (2006.01)
- C23F 1/00 (2006.01)
- H01L 21/306 (2006.01)
- C23C 16/06 (2006.01)
- C23C 16/22 (2006.01)

(52) U.S. Cl. ............. 118/715; 156/345.33; 156/345.34
(58) Field of Classification Search .................. 118/715; 156/345.33, 345.34

See application file for complete search history.

(56) References Cited

U.S. PATENT DOCUMENTS

| 4,439,401 A | 3/1984 | Voll et al. |
| 4,588,000 A * | 5/1986 | Malin et al. ............ 141/1 |
| 5,322,567 A | 6/1994 | Deaton et al. |
| 5,441,568 A | 8/1995 | Cho et al. |
| 5,624,498 A | 4/1997 | Lee et al. |
| 5,772,771 A | 6/1998 | Li et al. |
| 5,804,259 A | 9/1998 | Robles |
| 5,851,294 A | 12/1998 | Young et al. |
| 5,865,896 A | 2/1999 | Nowak et al. |
| 5,994,662 A | 11/1999 | Murugesh |
| 6,013,155 A | 1/2000 | McMillin et al. |

(Continued)

FOREIGN PATENT DOCUMENTS

EP  702392 A2  3/1996

(Continued)

OTHER PUBLICATIONS

Non-Final Office Action for US Appl. No. 11/016,166 mailed on Oct. 4, 2006; 9 pages.

(Continued)

*Primary Examiner*—Rudy Zervigon
(74) *Attorney, Agent, or Firm*—Townsend and Townsend and Crew (57) ABSTRACT

A gas distributor for use in a semiconductor process chamber comprises a body. The body includes a first channel formed within the body and adapted to pass a first fluid from a first fluid supply line through the first channel to a first opening. A second channel is formed within the body and adapted to pass a second fluid from a second fluid supply line through the second channel to a second opening. The first and second openings are arranged to mix the fluids outside the body after the fluids pass through the openings.

8 Claims, 10 Drawing Sheets

U.S. PATENT DOCUMENTS

| | | | |
|---|---|---|---|
| 6,070,551 | A | 6/2000 | Li et al. |
| 6,083,344 | A | 7/2000 | Hanawa et al. |
| 6,143,078 | A | 11/2000 | Ishikawa et al. |
| 6,170,428 | B1 | 1/2001 | Redeker et al. |
| 6,217,658 | B1 | 4/2001 | Orczyk et al. |
| 6,302,965 | B1 | 10/2001 | Umotoy et al. |
| 6,335,288 | B1 | 1/2002 | Kwan et al. |
| 6,383,964 | B1 | 5/2002 | Nakahara et al. |
| 6,416,823 | B2 | 7/2002 | Li et al. |
| 6,444,039 | B1 | 9/2002 | Nguyen |
| 6,450,117 | B1 | 9/2002 | Murugesh et al. |
| 6,453,992 | B1 | 9/2002 | Kim |
| 6,589,610 | B2 | 7/2003 | Li et al. |
| 6,596,653 | B2 | 7/2003 | Tan et al. |
| 6,676,760 | B2 | 1/2004 | Kholodenko et al. |
| 6,737,812 | B2 | 5/2004 | Yuasa et al. |
| 6,786,973 | B2 | 9/2004 | Strauch et al. |
| 6,800,139 | B1 | 10/2004 | Shinriki et al. |
| 6,821,910 | B2 | 11/2004 | Adomaitis et al. |
| 6,884,296 | B2 | 4/2005 | Basceri et al. |
| 6,960,262 | B2 | 11/2005 | Sasaki et al. |
| 6,989,061 | B2 | 1/2006 | DeMent et al. |
| 7,105,060 | B2 | 9/2006 | Shimogaki et al. |
| 7,183,227 | B1 | 2/2007 | Rasheed et al. |
| 7,294,207 | B2 | 11/2007 | Strauch et al. |
| 7,316,761 | B2 | 1/2008 | Doan et al. |
| 7,510,624 | B2 | 3/2009 | Liang |
| 2001/0033900 | A1 | 10/2001 | M'Saad et al. |
| 2002/0039625 | A1 | 4/2002 | Powell et al. |
| 2002/0187655 | A1 | 12/2002 | Tan et al. |
| 2003/0159656 | A1 | 8/2003 | Tan et al. |
| 2003/0177977 | A1 | 9/2003 | Strauch et al. |
| 2004/0060514 | A1 | 4/2004 | Janakiraman et al. |
| 2004/0126952 | A1 | 7/2004 | Gondhalekar et al. |
| 2004/0231798 | A1 | 11/2004 | Gondhalekar et al. |
| 2005/0000441 | A1 | 1/2005 | Kaeppeler et al. |
| 2005/0218115 | A1 | 10/2005 | Lei et al. |
| 2006/0048707 | A1 | 3/2006 | Lei et al. |
| 2006/0075967 | A1 | 4/2006 | Lu et al. |
| 2006/0130756 | A1 | 6/2006 | Liang et al. |
| 2006/0196410 | A1 | 9/2006 | Hishitani et al. |
| 2006/0196420 | A1 | 9/2006 | Ushakov et al. |
| 2006/0196603 | A1 | 9/2006 | Lei et al. |
| 2008/0121177 | A1 | 5/2008 | Bang et al. |
| 2008/0121179 | A1 | 5/2008 | Park et al. |
| 2008/0124944 | A1 | 5/2008 | Park et al. |
| 2008/0185284 | A1 | 8/2008 | Chen et al. |
| 2008/0188087 | A1 | 8/2008 | Chen et al. |
| 2008/0188090 | A1 | 8/2008 | Chen et al. |
| 2009/0042407 | A1 | 2/2009 | Bang et al. |
| 2009/0093129 | A1 | 4/2009 | Park et al. |

FOREIGN PATENT DOCUMENTS

| | | |
|---|---|---|
| JP | 55-166926 | 12/1980 |
| JP | 2006-310481 A | 11/2006 |
| JP | 2007-305890 A | 11/2007 |
| WO | WO 2006/096674 A1 | 9/2006 |

OTHER PUBLICATIONS

Notice of Allowance for US Appl. No. 11/016,166 mailed on Nov. 25, 2008; 9 pages.

Non-Final Office Action for U.S. Appl. No. 11/075,527 mailed on Jan. 15, 2008; 17 pages.

Final Office Action for U.S. Appl. No. 11/075,527 mailed on Aug. 6, 2008; 18 pages.

Non-Final Office Action for U.S. Appl. No. 11/075,527 mailed on Oct. 30, 2008; 17 pages.

Final Office Action for U.S. Appl. No. 11/564,105 mailed on Jan. 8, 2009; 12 pages.

Non-Final Office Action for U.S. Appl. No. 11/564,167 mailed on Dec. 16, 2008; 15 pages.

Written Opinion for PCT/US2006/008003 mailed on Jun. 28, 2006; 6 pages.

Search Report for PCT/US2006/008003 mailed on Jun. 28, 2006; 3 pages.

Non-Final Office Action for U.S. Appl. No. 11/075,527 mailed on Oct. 14, 2009; 22 pages.

Non-Final Office Action for U.S. Appl. No. 11/564,150 mailed on Jan. 6, 2010; 20 pages.

Non-Final Office Action for U.S. Appl. No. 12/253,687 mailed on Dec. 31, 2009; 9 pages.

Notice of Allowance for U.S. Appl. No. 11/075,527 mailed on Mar. 10, 2010; 6 pages.

\* cited by examiner

DUAL TOP GAS FEED THROUGH DISTRIBUTOR FOR HIGH DENSITY PLASMA CHAMBER

BACKGROUND OF THE INVENTION

The present invention relates generally to the field of semiconductor processing equipment. More particularly, the present invention relates to methods and apparatus for depositing thin films, for example with gas distributors, used in the formation of integrated circuits.

One of the primary steps in the fabrication of modern semiconductor devices is the formation of a film, such as a silicon oxide film, on a semiconductor substrate. Silicon oxide is widely used as dielectric layer in the manufacture of semiconductor devices. As is well known, a silicon oxide film can be deposited by a thermal chemical-vapor deposition ("CVD") process or by a plasma-enhanced chemical-vapor deposition ("PECVD") process. In a conventional thermal CVD process, reactive gases are supplied to a surface of the substrate, where heat-induced chemical reactions take place to produce a desired film. In a conventional plasma-deposition process, a controlled plasma is formed to decompose and/or energize reactive species to produce the desired film.

Semiconductor device geometries have decreased significantly in size since such devices were first introduced several decades ago, and continue to be reduced in size. This continuing reduction in the scale of device geometry has resulted in a dramatic increase in the density of circuit elements and interconnections formed in integrated circuits fabricated on a semiconductor substrate. One persistent challenge faced by semiconductor manufacturers in the design and fabrication of such densely packed integrated circuits is the desire to prevent spurious interactions between circuit elements, a goal that has required ongoing innovation as geometry scales continue to decrease.

Unwanted interactions are typically prevented by providing spaces between adjacent elements that are filled with a dielectric material to isolate the elements both physically and electrically. Such spaces are sometimes referred to herein as "gaps" or "trenches," and the processes for filling such spaces are commonly referred to in the art as "gapfill" processes. The ability of a given process to produce a film that completely fills such gaps is thus often referred to as the "gapfill ability" of the process, with the film described as a "gapfill layer" or "gapfill film." As circuit densities increase with smaller feature sizes, the widths of these gaps decrease, resulting in an increase in their aspect ratio, which is defined by the ratio of the gap's height to its depth. High-aspect-ratio gaps are difficult to fill completely using conventional CVD techniques, which tend to have relatively poor gapfill abilities. One family of dielectric films that is commonly used to fill gaps in intermetal dielectric ("IMD") applications, premetal dielectric ("PMD") applications, and shallow-trench-isolation ("STI") applications, among others, is silicon oxide (sometimes also referred to as "silica glass" or "silicate glass").

Some integrated circuit manufacturers have turned to the use of high-density plasma CVD ("HDP-CVD") systems in depositing silicon oxide gapfill layers. Such systems form a plasma that has a density greater than about $10^{11}$ ions/cm$^3$, which is about two orders of magnitude greater than the plasma density provided by a standard capacitively coupled plasma CVD system. Inductively coupled plasma ("ICP") systems are examples of HDP-CVD systems. One factor that allows films deposited by such HDP-CVD techniques to have improved gapfill characteristics is the occurrence of sputtering simultaneous with deposition of material. Sputtering is a mechanical process by which material is ejected by impact, and is promoted by the high ionic density of the plasma in HDP-CVD processes. The sputtering component of HDP deposition thus slows deposition on certain features, such as the corners of raised surfaces, thereby contributing to the increased gapfill ability.

Even with the use of HDP and ICP processes, there remain a number of persistent challenges in achieving desired deposition properties. These include the need to manage thermal characteristics of the plasma within a processing chamber, particularly with high-energy processes that may result in temperatures that damage structures in the chamber. In addition, there is a general desire to provide deposition processes that are uniform across a wafer. Nonuniformities lead to inconsistencies in device performance and may result from a number of different factors. The deposition characteristics at different points over a wafer result from a complex interplay of a number of different effects. For example, the way in which gas is introduced into the chamber, the level of power used to ionize precursor species, the use of electrical fields to direct ions, and the like, may ultimately affect the uniformity of deposition characteristics across a wafer. In addition, the way in which these effects are manifested may depend on the physical shape and size, of the chamber, such as by providing different diffusive effects that affect the distribution of ions in the chamber.

One particular challenge with HDP and ICP processes is the management of chemical reactions during the deposition process so that the chemical characteristics of the layer deposited with the HDP/CVD process are uniform across the area wafer. In particular, work in connection with the present invention suggests that incomplete reaction of $SiH_4$ with $O_2$ can lead to the deposition of disproportionate amounts of Si over some regions of a coated wafer, for example excessive Si deposited centrally so that the coating is "silicon rich" centrally. As the chemical characteristics of a deposited layer are related to the physical properties of the layer, for example dielectric properties and resistance to etching, it would be desirable to provide deposited layers with uniform chemical. Although prior techniques to provide uniform chemical reactions and depositions by injecting both $SiH_4$ and $O_2$ into the processing chamber have met with some success, further improvements in the chemical uniformity of deposited layers is continually sought.

There is accordingly a general need in the art for improved systems for generating plasma that improve deposition across wafers in HDP and ICP processes.

BRIEF SUMMARY OF THE INVENTION

According to the present invention, methods and apparatus related to the field of semiconductor processing equipment are provided. More particularly, the present invention relates to methods and apparatus for depositing thin films, for example with gas distributors. Merely by way of example, the methods and apparatus of the present invention are used in HDP/CVD processes. The methods and apparatus can be applied to other processes for semiconductor substrates, for example those used in the formation of integrated circuits.

In one embodiment of the present invention, a gas distributor for use in a semiconductor process chamber comprises a body. The body includes a first channel formed within the body and adapted to pass a first fluid from a first fluid supply line through the first channel to a first opening. A second channel is formed within the body and adapted to pass a second fluid from a second fluid supply line through the second channel to a second opening. The first and second openings are arranged to mix the fluids outside the body after the fluids pass through the openings.

In another embodiment of the present invention, a gas distributor for use in a semiconductor process chamber comprises a body. The body includes a lower surface, and a plurality of first openings disposed on the lower surface. The openings are adapted to pass a first fluid from a fluid first supply line to the chamber. A second opening is disposed on the lower surface and adapted to pass a second fluid from a second fluid supply line. The first openings are disposed around the second opening and arranged to mix the fluids outside the body after the fluids pass through the openings.

In yet another embodiment of the present invention, a method of depositing a thin film in a semiconductor process chamber comprises passing a first fluid through a first channel. The first channel is disposed within a body of a gas distributor. A second fluid is passed through a second channel disposed within the body of the gas distributor. The first fluid remains separated from the second fluid while the fluids pass through the channels. The fluids are expelled from the channels to mix the first fluid with the second fluid outside the gas distributor and the first fluid undergoes a chemical reaction with the second fluid outside the gas distributor.

In a further embodiment of the present invention, a device for use with a semiconductor process to deposit a layer on a semiconductor wafer comprises a top dome and a side wall positioned to define a chamber. A support is adapted to support the semiconductor wafer. A gas distributor comprises a body that extends downward into the chamber centrally near the top dome. The body comprises a first channel formed therein and is adapted to pass a first fluid downward to a first opening into the chamber. The body comprising a second channel formed therein and is adapted to pass a second fluid downward through the gas distributor to a second opening into the chamber. A first fluid supply line is coupled to the first channel formed in the body of gas distributor. A second fluid supply line is coupled to the second channel formed in the body of the gas distributor to separate the second fluid from the first fluid while the fluids are passed from the supply lines to the openings. The openings are adapted to mix the first fluid with the second fluid outside the body of the gas distributor above the wafer support.

In a yet further embodiment of the present invention, a gas distributor for use in a semiconductor process chamber comprises a body. The body includes a channel adapted to pass a fluid from a fluid supply line to at least one opening. The body also includes a connector adapted to engage a support and hold the distributor and the at least one opening in a predetermined orientation relative to the support.

In another embodiment of the present invention, a gas distributor for use in a semiconductor processor chamber comprises a body. The body includes a first channel adapted to pass a first fluid from a first fluid supply line to a first opening formed in the distributor. The body also includes a second channel adapted to pass a second fluid from a second fluid supply line to a second opening formed in the distributor. The body includes a connector that is adapted to engage a support and hold the distributor and the channels in a predetermined orientation relative to the support and the fluid supply lines.

In another embodiment of the present invention a method of installing a gas distributor in a semiconductor process chamber comprises aligning the gas distributor with a support in a first orientation of the gas distributor. The gas distributor is rotated from the first orientation to a predetermined orientation to attach the gas distributor to the support. The gas distributor is rotated no more than half a turn from the first orientation to the pre-determined orientation.

Embodiments of the present invention provide improved uniformity in a layer of material deposited on a semiconductor substrate, for example improved uniformity of an $SiO_2$ layer. In particular, embodiments of the present provide channels to inject a fluid, for example $O_2$ gas, centrally from a gas distributor to avoid deposition of a silicon rich layer centrally on the wafer.

A further understanding of the nature and advantages of the present invention may be realized by reference to the remaining portions of the specification and the drawings.

DETAILED DESCRIPTION OF THE INVENTION

According to the present invention, methods and apparatus related to the field of semiconductor processing equipment are provided. More particularly, the present invention relates to methods and apparatus for depositing thin films, for example with gas distributors, used in the formation of integrated circuits. Merely by way of example, the method and apparatus of the present invention are used in HDP/CVD processes. The method and apparatus can be applied to other processes for semiconductor substrates, for example those used in the formation of integrated circuits.

Figure 1A:
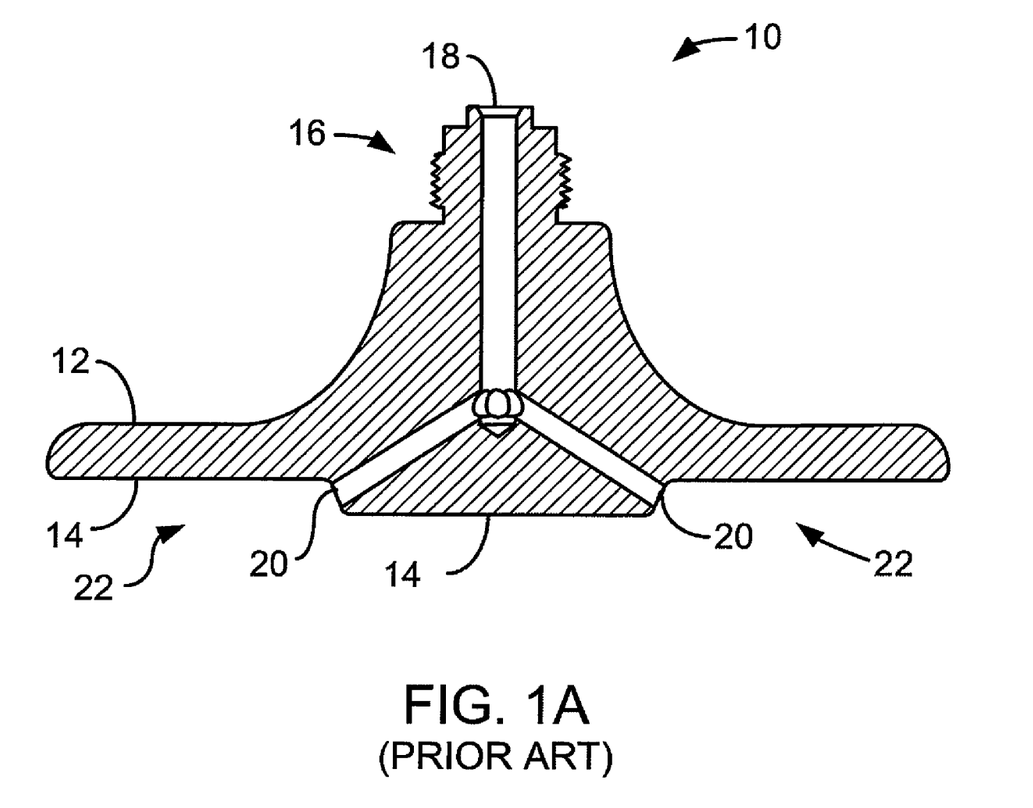
FIG. 1A is a cross-sectional view of a previously known gas distributor.

FIG. 1A shows a previously known gas distributor. Gas distributor 10 has a gas deflecting surface 12 and a gas distributor face 14. Gas deflecting surface 12 provides a pathway for cleaning gases during a chamber clean process. Cleaning gases are directed to the chamber walls instead of a substrate support member located directly below the gas distributor. The gas distributor 10 is connected to a chamber wall at a proximal portion 16. During a CVD process, a deposition gas is supplied to the gas distributor 10 at the proximal end 18. This deposition gas flows through gas distributor 10, exiting at apertures 20, and onto a substrate position on the substrate support member. A step 22 extends circumferentially around gas distributor face 14 to define an elevated portion of gas distributor face 14. Several apertures 20 are disposed on the gas distributor face 14 along step 22.

1. Exemplary ICP Chamber

Figure 1B:
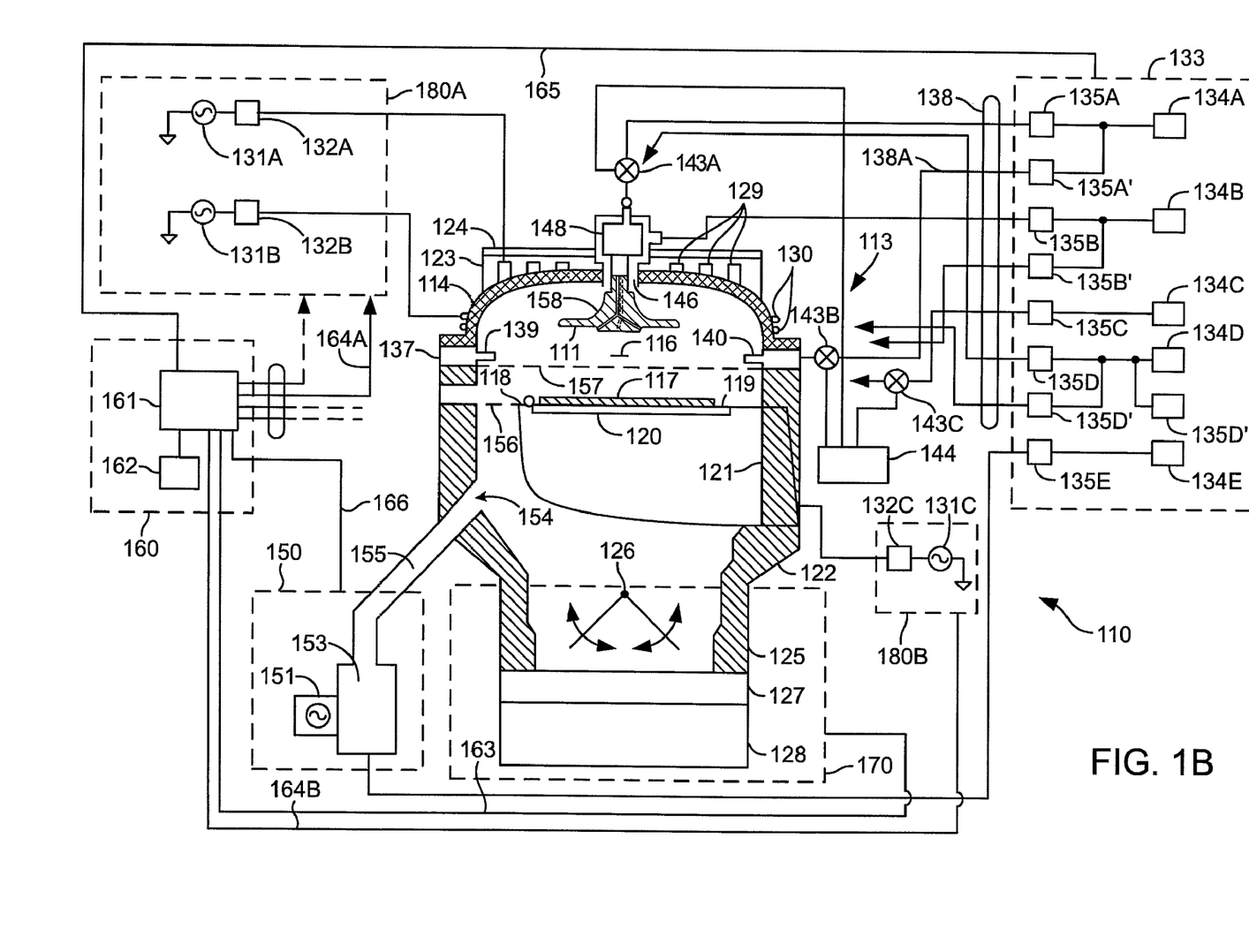
FIG. 1B is a simplified cross-sectional view of an exemplary ICP reactor system.

Embodiments of the invention use the ULTIMA™ system manufactured by APPLIED MATERIALS, INC., of Santa Clara, Calif., a general description of which is provided in commonly assigned U.S. Pat. Nos. 5,994,662; 6,170,428; and 6,450,117; and U.S. patent application Ser. Nos. 10/963,030 and 11/075,527; the entire disclosures of these patents and applications are incorporated herein by reference. An overview of the ICP reactor is provided in connection with FIG. 1B. FIG. 1B schematically illustrates the structure of an exemplary HDP-CVD system 110 in one embodiment. The system 110 includes a chamber 113, a vacuum system 170, a source plasma system 180A, a bias plasma system 180B, a gas delivery system 133, and a remote plasma cleaning system 150.

The upper portion of chamber 113 includes a dome 114, which is made of a ceramic dielectric material, such as aluminum oxide or aluminum nitride, sapphire, SiC or quartz. A heater plate 123 and a cold plate 124 surmount, and are thermally coupled to, dome 114. Heater plate 123 and cold plate 124 allow control of the dome temperature to within about ±10° C. over a range of about 100° C. to 200° C. Dome 114 defines an upper boundary of a plasma processing region 116. Plasma processing region 116 is bounded on the bottom by the upper surface of a substrate 117 and a substrate support member 118.

The lower portion of chamber 113 includes a body member 122, which joins the chamber to the vacuum system. A base portion 121 of substrate support member 118 is mounted on, and forms a continuous inner surface with, body member 122. Substrates are transferred into and out of chamber 113 by a robot blade (not shown) through an insertion/removal opening (not shown) in the side of chamber 113. Lift pins (not shown) are raised and then lowered under the control of a motor (also not shown) to move the substrate from the robot blade at an upper loading position 157 to a lower processing position 156 in which the substrate is placed on a substrate receiving portion 119 of substrate support member 118. Substrate receiving portion 119 includes an electrostatic chuck 120 that secures the substrate to substrate support member 118 during substrate processing. In a preferred embodiment, substrate support member 118 is made from an aluminum oxide or aluminum ceramic material.

Vacuum system 170 includes throttle body 125, which houses twin-blade throttle valve 126 and is attached to gate valve 127 and turbo-molecular pump 128. It should be noted that throttle body 125 offers minimum obstruction to gas flow, and allows symmetric pumping. Gate valve 127 can isolate pump 128 from throttle body 125, and can also control chamber pressure by restricting the exhaust flow capacity when throttle valve 126 is fully open. The arrangement of the throttle valve, gate valve, and turbo-molecular pump allow accurate and stable control of chamber pressures from between about 1 millitorr to about 2 torr.

The source plasma system 180A includes a top coil 129 and side coil 130, mounted on dome 114. A symmetrical ground shield (not shown) reduces electrical coupling between the coils. Top coil 129 is powered by top source RF (SRF) generator 13 1A, whereas side coil 130 is powered by side SRF generator 131B, allowing independent power levels and frequencies of operation for each coil. This dual coil system allows control of the radial ion density in chamber 113, thereby improving plasma uniformity. Side coil 130 and top coil 129 are typically inductively driven, which does not require a complimentary electrode. In a specific embodiment, the top source RF generator 131A provides up to 2,500 watts of RF power at nominally 2 MHz and the side source RF generator 131B provides up to 5,000 watts of RF power at nominally 2 MHz. The operating frequencies of the top and side RF generators may be offset from the nominal operating frequency (e.g. to 1.7 1.9 MHz and 1.9 2.1 MHz, respectively) to improve plasma-generation efficiency.

A bias plasma system 180B includes a bias RF ("BRF") generator 131 C and a bias matching network 132C. The bias plasma system 180B capacitively couples substrate portion 117 to body member 122, which act as complimentary electrodes. The bias plasma system 180B serves to enhance the transport of plasma species (e.g., ions) created by the source plasma system 180A to the surface of the substrate. In a specific embodiment, bias RF generator provides up to 5,000 watts of RF power at 13.56 MHz.

RF generators 131A and 131B include digitally controlled synthesizers and operate over a frequency range between about 1.8 to about 2.1 MHz. Each generator includes an RF control circuit (not shown) that measures reflected power from the chamber and coil back to the generator and adjusts the frequency of operation to obtain the lowest reflected power, as understood by a person of ordinary skill in the art. RF generators are typically designed to operate into a load with a characteristic impedance of 50 ohms. RF power may be reflected from loads that have a different characteristic impedance than the generator. This can reduce power transferred to the load. Additionally, power reflected from the load back to the generator may overload and damage the generator. Because the impedance of a plasma may range from less than 5 ohms to over 900 ohms, depending on the plasma ion density, among other factors, and because reflected power may be a function of frequency, adjusting the generator frequency according to the reflected power increases the power transferred from the RF generator to the plasma and protects the generator. Another way to reduce reflected power and improve efficiency is with a matching network.

Matching networks 132A and 132B match the output impedance of generators 131A and 131B with top coil 129 and side coil 130, respectively. The RF control circuit may tune both matching networks by changing the value of capacitors within the matching networks to match the generator to the load as the load changes. The RF control circuit may tune a matching network when the power reflected from the load back to the generator exceeds a certain limit. One way to provide a constant match, and effectively disable the RF control circuit from tuning the matching network, is to set the reflected power limit above any expected value of reflected power. This may help stabilize a plasma under some conditions by holding the matching network constant at its most recent condition.

Other measures may also help stabilize a plasma. For example, the RF control circuit can be used to determine the power delivered to the load (plasma) and may increase or decrease the generator output power to keep the delivered power substantially constant during deposition of a layer.

A gas delivery system 133 provides gases from several sources, 134A-134E chamber for processing the substrate via gas delivery lines 138 (only some of which are shown). As would be understood by a person of skill in the art, the actual sources used for sources 134A-134E and the actual connection of delivery lines 138 to chamber 113 varies depending on the deposition and cleaning processes executed within chamber 113. Gases are introduced into chamber 113 through a gas ring 137 and/or a gas distributor 111. In many embodiments, gas distributor 111 comprises a first channel adapted to inject a source gas, such as $SiH_4$, and a second channel adapted to inject an oxidizer gas, such as $O_2$, which undergoes a chemical reaction with the source gas to form $SiO_2$ on the substrate. Work in relation with embodiments of the present invention suggests that such gas distributors can provide a uniform deposition of $SiO_2$ that avoids silicon rich deposition in the central region of the substrate, for example embodiments that use gas rings with nozzles distributed around the substrate near the side walls of the chamber.

In one embodiment, first and second gas sources, 134A and 134B, and first and second gas flow controllers, 135A' and 135B', provide gas to ring plenum in gas ring 137 via gas delivery lines 138 (only some of which are shown). Gas ring 137 has a plurality of source gas nozzles 139 (only one of which is shown for purposes of illustration) that provide a uniform flow of gas over the substrate. Nozzle length and nozzle angle may be changed to allow tailoring of the uniformity profile and gas utilization efficiency for a particular process within an individual chamber. In a preferred embodiment, gas ring 137 has 12 source gas nozzles made from an aluminum oxide ceramic. In many embodiments, source gas nozzles 139 inject a source gas comprising $SiH_4$ into the chamber, which can be oxidized by an oxidizer gas, such as $O_2$, injected from oxidizer nozzles to form the dielectric layer.

Gas ring 137 also has a plurality of oxidizer gas nozzles 140 (only one of which is shown), which in a preferred embodiment are co-planar with and shorter than source gas nozzles 139, and in one embodiment receive gas from body plenum. In some embodiments it is desirable not to mix source gases and oxidizer gases before injecting the gases into chamber 113. In other embodiments, oxidizer gas and source gas may be mixed prior to injecting the gases into chamber 113 by providing apertures (not shown) between body plenum and gas ring plenum. In one embodiment, third, fourth, and fifth gas sources, 134C, 134D, and 134D', and third and fourth gas flow controllers, 135C and 135D', provide gas to body plenum via gas delivery lines 138. Additional valves, such as 143B (other valves not shown), may shut off gas from the flow controllers to the chamber.

In embodiments where flammable, toxic, or corrosive gases are used, it may be desirable to eliminate gas remaining in the gas delivery lines after a deposition. This may be accomplished using a 3-way valve, such as valve 143B, to isolate chamber 113 from delivery line 138A and to vent delivery line 138A to vacuum foreline 144, for example. As shown in FIG. 1B, other similar valves, such as 143A and 143C, may be incorporated on other gas delivery lines.

Chamber 113 also has a gas distributor 111 (or top nozzle) and top vent 146. Gas distributor 111 and top vent 146 allow independent control of top and side flows of the gases, which improves film uniformity and allows fine adjustment of the film's deposition and doping parameters. Top vent 146 is an annular opening around gas distributor 111. Gas distributor 111 includes a plurality of apertures in a step according to an embodiment of the present invention for improved gas distribution. In one embodiment, first gas source 134A supplies source gas nozzles 139 and gas distributor 111. Source nozzle multifunction controller (MFC) 135A' controls the amount of gas delivered to source gas nozzles 139 and top nozzle MFC 135A controls the amount of gas delivered to gas distributor 111. Similarly, two MFCs 135B and 135B' may be used to control the flow of oxygen to both top vent 146 and oxidizer gas nozzles 140 from a single source of oxygen, such as source 134B. The gases supplied to gas distributor 111 and top vent 146 may be kept separate prior to flowing the gases into chamber 113, or the gases may be mixed in top plenum 148 before they flow into chamber 113. Separate sources of the same gas may be used to supply various portions of the chamber.

A baffle 158 is formed on gas distributor 111 to direct flows of clean gas toward the chamber wall and can also be used to direct flows of remotely generated plasma and clean gas. As described in greater detail herein below, the gas distributor includes two separate channels that pass two separate gases into chamber 113 where the gases mix and react above the semiconductor substrate.

A remote microwave-generated plasma cleaning system 150 is provided to periodically clean deposition residues from chamber components. The cleaning system includes a remote microwave generator 151 that creates a plasma from a cleaning gas source 134E (e.g., molecular fluorine, nitrogen trifluoride, other fluorocarbons or equivalents) in reactor cavity 153. The reactive species resulting from this plasma are conveyed to chamber 113 through cleaning gas feed port 154 via applicator tube 155. The materials used to contain the cleaning plasma (e.g., cavity 153 and applicator tube 155) must be resistant to attack by the plasma. Generating the cleaning plasma in a remote cavity allows the use of an efficient microwave generator and does not subject chamber components to the temperature, radiation, or bombardment of the glow discharge that may be present in a plasma formed in situ. Consequently, relatively sensitive components, such as electrostatic chuck 120, do not need to be covered with a dummy wafer or otherwise protected, as may be required with an in situ plasma cleaning process.

In FIG. 1B, the plasma-cleaning system 150 is shown below the chamber 113, although other positions may alternatively be used, for example above chamber 113 as described in U.S. application Ser. No. 10/963,030, the full disclosure of which has been previously incorporated herein by reference. In this alternate embodiment, the distance between the reactor cavity and feed port are kept as short as practical, since the concentration of desirable plasma species may decline with distance from reactor cavity. With a cleaning gas feed positioned at the top of the chamber above the baffle, remotely generated plasma species provided through the cleaning gas feed port can be directed to the sides of the chamber by the baffle.

System controller 160 controls the operation of system 110. In a preferred embodiment, controller 160 includes a memory 162, which comprises a tangible medium such as a hard disk drive, a floppy disk drive (not shown), and a card rack (not shown) coupled to a processor 161. The card rack may contain a single-board computer (SBC) (not shown), analog and digital input/output boards (not shown), interface boards (not shown), and stepper motor controller boards (not shown). The system controller conforms to the Versa Modular European ("VME") standard, which defines board, card cage, and connector dimensions and types. The VME standard also defines the bus structure as having a 16-bit data bus and 24-bit address bus. System controller 160 operates under the control of a computer program stored on the tangible medium for example the hard disk drive, or through other computer programs, such as programs stored on a removable disk. The computer program dictates, for example, the timing, mixture of gases, RF power levels and other parameters of a particular process. The interface between a user and the system controller is via a monitor, such as a cathode ray tube ("CRT"), and a light pen.

System controller 160 controls the season time of the chamber and gases used to season the chamber, the clean time and gases used to clean the chamber, and the application of plasma with the HDP CVD process. To achieve this control, the system controller 160 is coupled to many of the components of system 110. For example, system controller 160 is coupled to vacuum system 170, source plasma system 180A, bias plasma system 180B, gas delivery system 133, and remote plasma cleaning system 150. System controller 160 is coupled to vacuum system 170 with a line 163. System controller 160 is coupled to source plasma system I 80 with a line 164A and to bias plasma system 180B with a line 164B. System controller 160 is coupled to gas delivery system 133 with a line 165. System controller 160 is coupled to remote plasma cleaning system 150 with a line 166. Lines 163, 164A, 164B, 165 and 166 transmit control signals from system controller 160 to vacuum system 170, source plasma system 180A, bias plasma system 180B, gas delivery system 133, and remote plasma cleaning system 150, respectively. For example, system controller 160 separately controls each of flow controllers 135A to 135E and 135A' to 135D' with line 165. Line 165 can comprise several separate control lines connected to each flow controller. It will be understood that system controller 160 can include several distributed processors to control the components of system 110.

2. Gas Distributor Characteristics

Figure 2A:
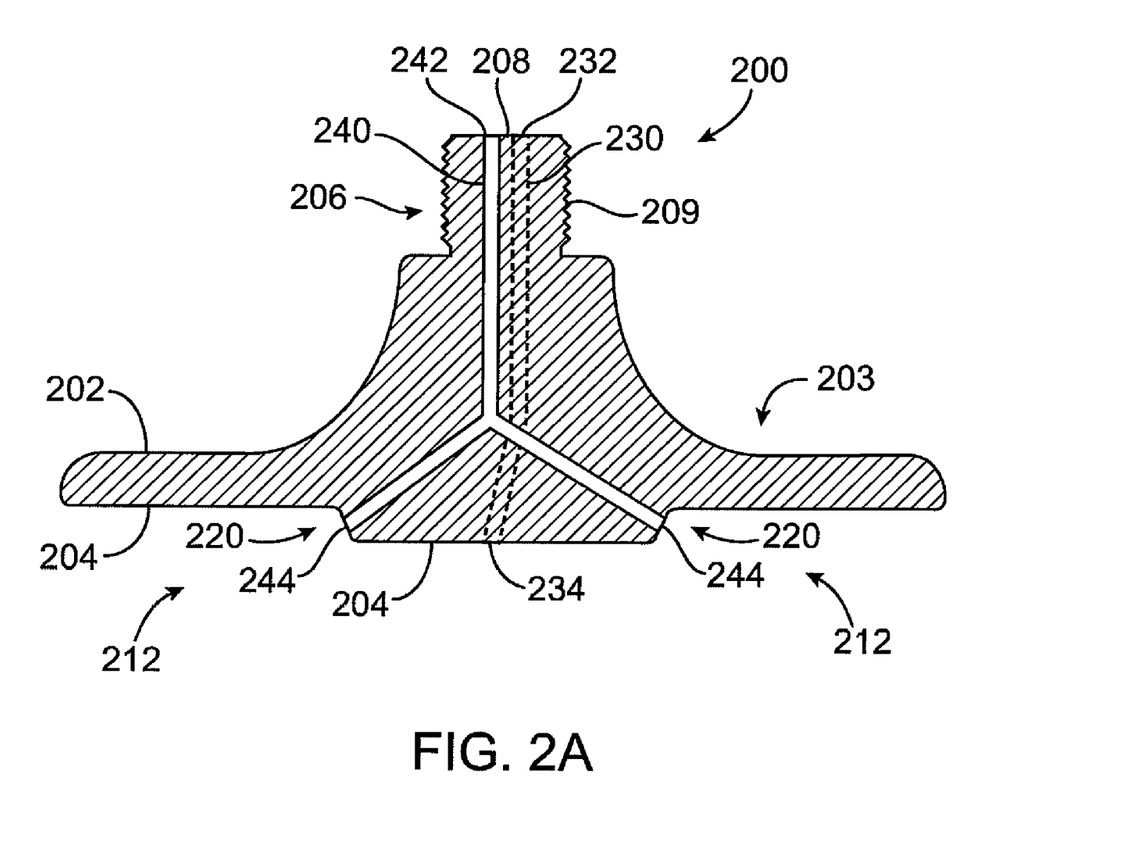
FIG. 2A shows cross sectional view of a gas distributor having two channels formed therein to separately pass a first fluid and a second fluid according to an embodiment of the present invention.

FIG. 2A shows cross sectional view of a gas distributor 200 having two channels formed therein to separately pass a first fluid and a second fluid according to an embodiment of the present invention. Gas distributor 200 includes an upper end 208 located near a neck 206 that supports the gas distributor. Neck 206 includes threads adapted to attach the gas distributor to a support connected to fluid supply lines, for example gas delivery lines as described above. Gas distributor 200 includes an upper surface 202 and a baffle 203. Baffle 203 includes upper surface 202 that is shaped to deflect a clean gas toward the chamber wall. Gas distributor 200 includes a lower surface 204. Lower surface 204 is disposed opposite to upper surface 202. Lower surface 204 includes a gas distribution surface 212 that is shaped to evenly distribute deposition gases on the substrate below. Lower surface 204 and gas distribution surface 212 include a step 220 to improve mixing of gasses in the chamber. Step 220 includes at least one opening 244 formed thereon. Gas distributor 200 includes a channel 240 adapted to pass a first fluid, for example a gas such as $SiH_4$. In alternate embodiments channel 240 is adapted to pass a fluid that comprises a liquid. Channel 240 extends from an opening 242, or inlet, at end 208 to the at least one opening 244 formed in step 220. At least one opening 244 is disposed circumferentially around gas distribution surface 212 along step 220. Gas distributor 200 also includes a second channel 230 adapted to pass a second fluid, for example a gas such as $O_2$. In alternate embodiments channel 230 is adapted to pass a fluid that comprises a liquid. Channel 230 extends from an opening 232, or inlet, formed in first end 208 to an opening 234, or outlet, formed in lower surface 204. In many embodiments, the $SiH_4$ fluid from channel 240 can undergo a chemical reaction with the $O_2$ fluid from channel 230 to form $SiO_2$ that is deposited on the substrate to form the dielectric layer. This chemical reaction of the gases from the distributor in the chamber can reduce the richness of Si in the dielectric layer formed on the substrate. Gas distributor 200 is typically made from a single piece of material, for example a ceramic material comprising at least one of aluminum oxide ($Al_2O_3$), aluminum nitride (AlN), sapphire or silicon carbide. While embodiments of the present invention can be implemented with any gas distributor, exemplary examples of gas distributors suitable for incorporating embodiments the present invention are described in U.S. application Ser. No. 11/075,527, the full disclosure of which has been previously incorporated by reference.

Figure 2B:
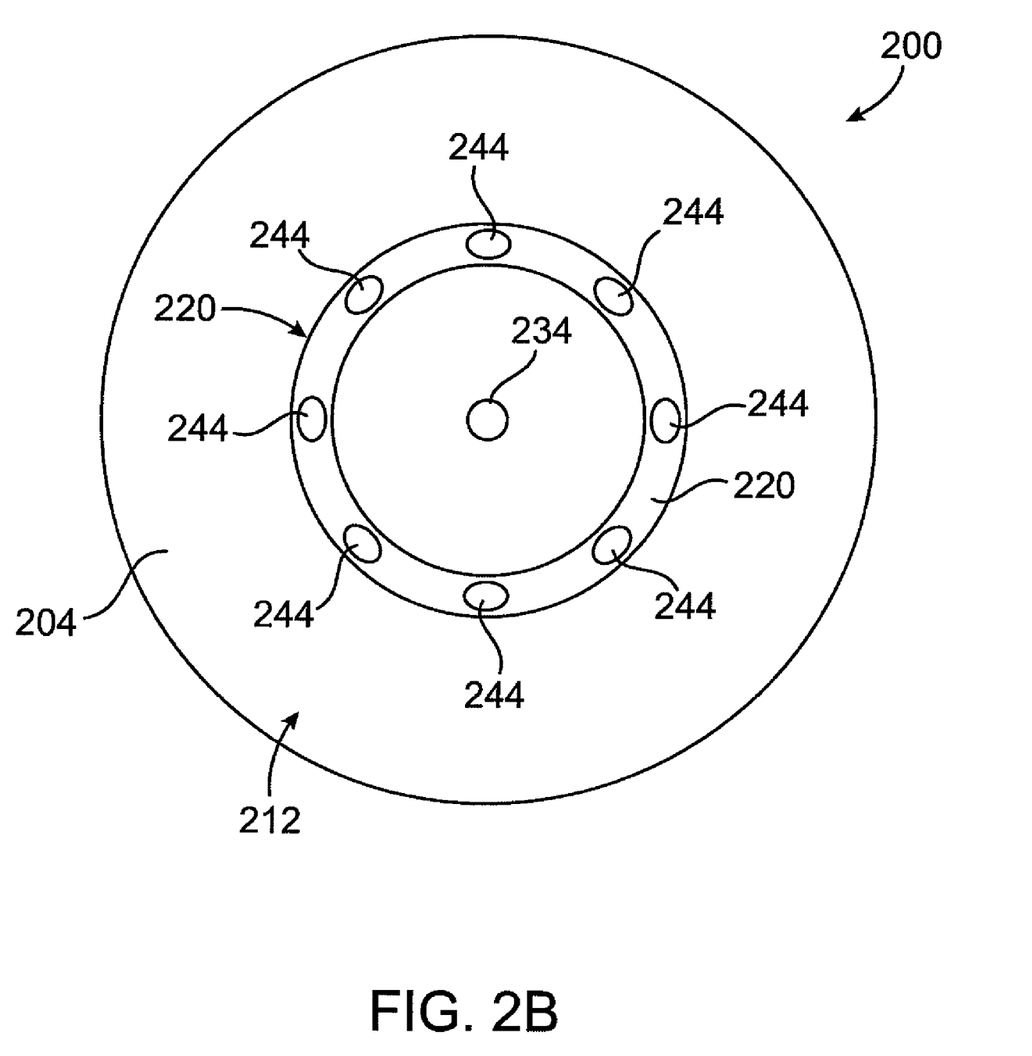
FIG. 2B shows a bottom view of the gas distributor as hi FIG. 2A according to an embodiment of the present invention

FIG. 2B shows a bottom view of the gas distributor 200 as in FIG. 2A according to an embodiment of the present invention. At least one opening 244 includes 8 openings disposed circumferentially around gas distribution surface 212 along step 220. While eight openings are shown, the at least one opening can include a range from 2 to 16 openings, for example from 4 to 12 openings. Channel 240 includes as many branches as needed to connect opening 242 with at least one opening 244, for example 8 branches. Opening 234 is disposed centrally on gas distributor 200 and gas distribution surface 212. As gas distributor 200 is positioned centrally in the chamber as described above, opening 234 is positioned centrally in the chamber above the substrate support and substrate. While opening 234 is shown centrally in FIG. 2B, this opening can be disposed anywhere along lower surface 204 and can include at least two openings, for example four openings disposed along lower surface 204.

Figure 2C:
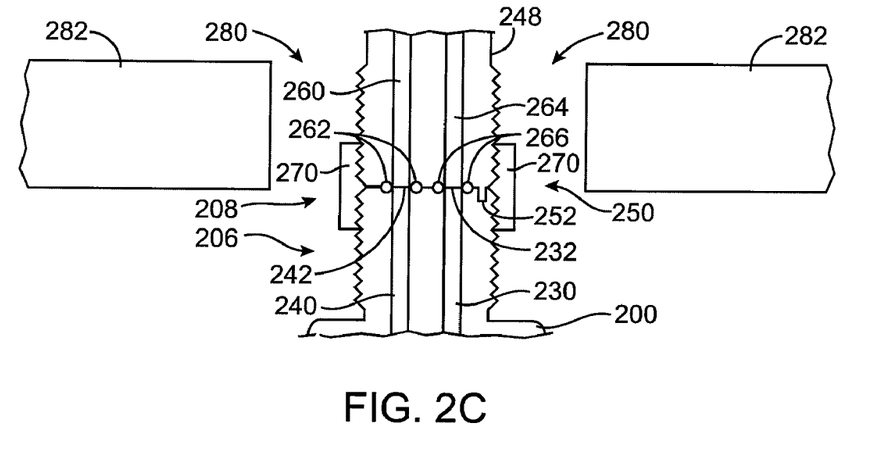
FIG. 2C shows a cross sectional view of a connector for the gas distributor as in FIGS. 2A and 2B connected to a support in a semiconductor process chamber according to an embodiment of the present invention.

FIG. 2C shows a cross sectional view of a connector 250 for gas distributor 200 as in FIGS. 2A and 2B connected to a support 248 in a semiconductor process chamber according to an embodiment of the present invention. Support 248 includes a channel 260 that is connected to first fluid supply line and adapted to pass the first fluid, and a channel 264 that is connected to a second fluid supply line and adapted to pass the second fluid. The first fluid supply line, for example a gas delivery line as described above, is connected to a flow controller under control of the system controller as described above. The second fluid supply line, for example a separate gas delivery line as described above, is connected to a flow controller under control of the system controller as described above. Thus, the system controller can separately control the flow of the first fluid through channel 260 and the flow of the second fluid through channel 264. A chamber dome 282 includes an opening and support 248 extends downward into the opening to form an annular opening 280. Clean gas can pass downward through annular opening 280 toward baffle 203 under computer control as described above. Baffle 203 deflects the clean gas from a first downward direction to a second horizontal direction away from the gas distributor and toward the chamber wall. Suitable clean gases include $F_2$, $NF_3$, $CF_4$, $C_2F_8$ and $O_2$. A separate flow controller and gas delivery line as described above can be provided for each of the gases to separately control injection of each gas into the chamber. Channel 260 is aligned with channel 240 to pass the first fluid from channel 260 to channel 240. Channel 264 is aligned with channel 230 to pass the second fluid from channel 264 to channel 230.

A connector 250 rigidly attaches neck 206 to support 248. Gas distributor 200 comprises components of connector 250.

Connector 250 includes a lock and key mechanism 252. Lock and key mechanism 252 is provided to align gas distributor 200 with support 248 in a predetermined angular orientation so that the channels are aligned and the first fluid passes to at least one opening 244 as intended and the second fluid passes to opening 232 as intended. Gas distributor 200 comprises at least a portion of lock and key mechanism 250, for example a lock (female end) that receives a key (male end) of the mechanism as shown in FIG. 2C. Connector 250 also includes a nut 270 with threads that rigidly attaches support 248 to neck 206 to support gas distributor 200. During installation, nut 270 can be initially positioned downward on neck 206 so that rotation of nut 270 will advance the nut upward and toward the support to engage the support while the components of the lock and key mechanism are engaged. An O-ring 262 seals the connection between channel 260 and channel 240 at upper end 208 of gas distributor 200. An O-ring 266 seals the connection between channel 264 and channel 230 at upper end 208 of gas distributor 200.

Referring again to FIGS. 2A to 2C, opening 234 is disposed centrally to direct a reactive fluid, for example $O_2$ gas, toward a center of a semiconductor substrate. Gas distributor 200 is positioned centrally above the semiconductor substrate and substrate support. As opening 234 is located centrally on gas distributor 200, opening 234 is located centrally above the substrate. A lower portion of channel 230 near opening 234 is directed toward a central portion of the semiconductor substrate and points toward a central portion of the semiconductor substrate. This location of opening 234 and alignment channel 230 toward the central region of the semiconductor substrate and support permits improved mixing of the reactive fluids provided by channels 230 and 240 respectively. For example, channel 240 passes a first reactive fluid that is oxidized, for example $SiH_4$ gas, and channel 230 passes a second reactive fluid that is reduced, for example $O_2$. The first reactive fluid reacts with the second reactive fluid to form the desired molecular species, for example $SiH_4$ reacts with $SiO_2$ to form $SiO_2$. The central injection of $O_2$ permits increased reaction of $O_2$ with $SiH_4$ to provide a uniform layer of $SiO_2$ and avoids formation of a silicon (Si) rich layer.

Figure 3A:
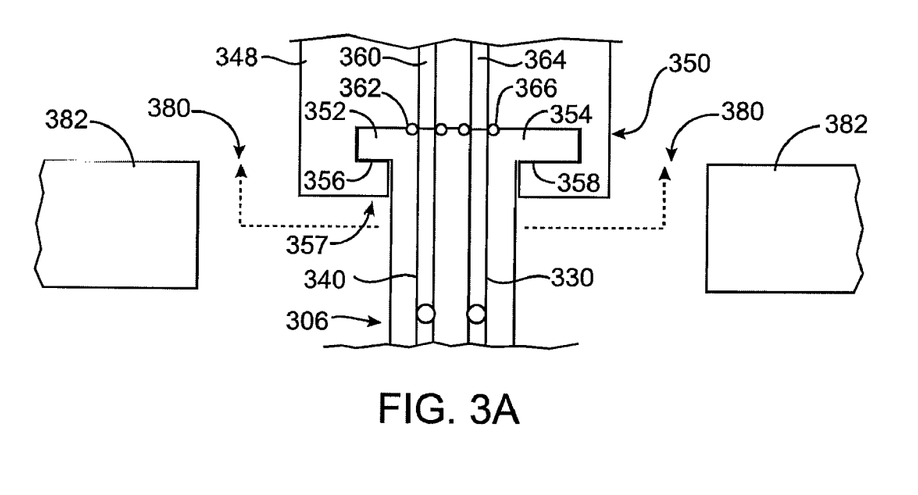
FIG. 3A shows side cross sectional view of a quarter turn connector to attach a gas distributor in a predetermined orientation to a support connected to gas supply lines according to an embodiment of the present invention.

FIG. 3A shows side cross sectional view of a quarter turn connector to attach a gas distributor in a predetermined orientation to a support on a gas supply line according to an embodiment of the present invention. A connector 350 rigidly connects a neck 306 of gas distributor as described above to a support 348 on a gas supply line. Connector 350 includes structures disposed on neck 306 to rigidly attach the gas distributor to the gas supply line in the predetermined orientation shown. Support 348 includes a channel 360 that is connected to a first fluid supply line and adapted to pass the first fluid, and a second channel 364 that is connected to a second fluid supply line and adapted to pass the second fluid. Neck 306 of the gas distributor includes a channel 340 aligned with channel 360 to pass the first fluid as described above. An O-ring 362 seal the connection of channel 360 with channel 340. Neck 306 includes a channel 330 aligned with channel 364 to pass the second fluid as described above. An O-ring 366 seals the connection of channel 364 with channel 330. Dome 382 includes an opening and support 348 extends into the opening to define annular opening 380. Annular opening 380 is adapted to pass clean gas as described above.

Connector 350 includes structures adapted to provide rigid attachment of neck 306 support 348 with a quarter (i.e. 90 degree) turn. For example, neck 306 includes a short flange 352 and a long flange 354. Support 348 includes a narrow channel 356 and a wide channel 358 formed thereon. Narrow channel 356 is adapted to receive and mates with short flange 352. Wide channel 358 is adapted to receive and mates with long flange 354. The quick turn connector connects the gas distributor to the support with no more than half a turn, for example with a quarter turn.

Figure 3B:
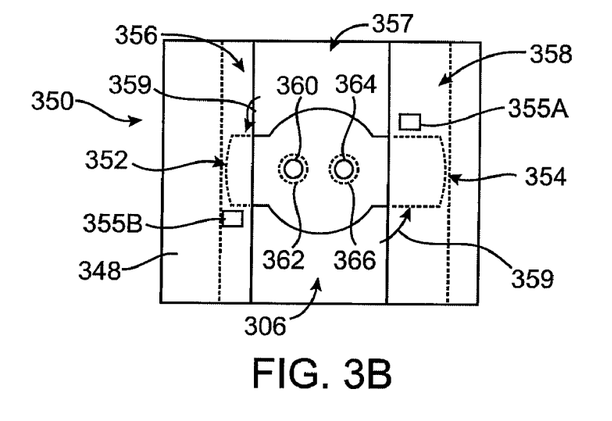
FIG. 3B shows an upward looking cross sectional view of the quarter turn connector of FIG. 3A according to an embodiment of the present invention.

FIG. 3B shows an upward looking cross sectional view of the quarter turn connector of FIG. 3A according to an embodiment of the present invention. The connector on the gas distributor comprises structures adapted to engage the support and limit rotation of the gas distributor at the predetermined orientation. Support 348 has a channel 357 formed thereon. Channel 357 is adapted to receive flange 352 and flange 354 while the flanges are positioned in a first orientation that is rotated 90 degrees from the position shown in FIG. 3B. In this first orientation the flanges are aligned along channel 357. Upon rotation of the neck and flanges from the first orientation to the predetermined orientation, short flange 352 and long flange 354 move as indicated by arrows 359. A stop 355A engages long flange 354 and limits motion of the flange. A stop 355B engages short flange 352 and limits motion of the flange. Thus rotation of neck 306 in a counter clockwise direction as shown in FIG. 3B causes the flanges to engage the stops and position the channels of the baffle and the baffle at the predetermined orientation in relation to the support and the channels of the support.

Figure 4A:
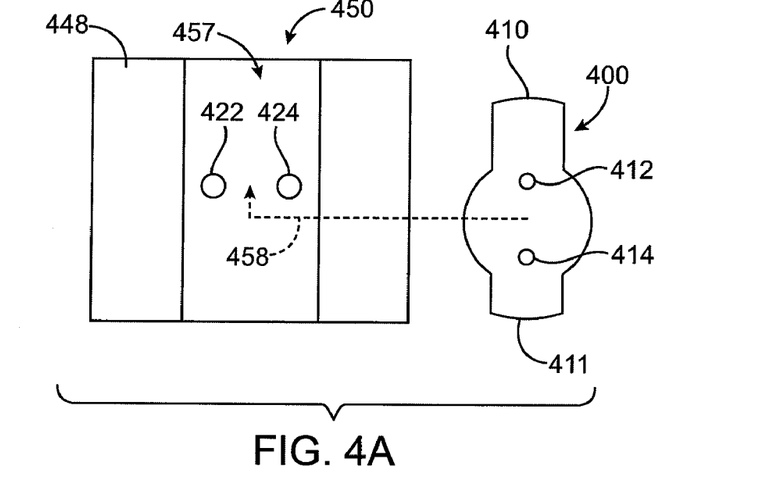
FIGS. 4A to 4C show installation of a quick turn connector on a gas distributor into a gas supply line support according to an embodiment of the present invention.
Figure 4B:
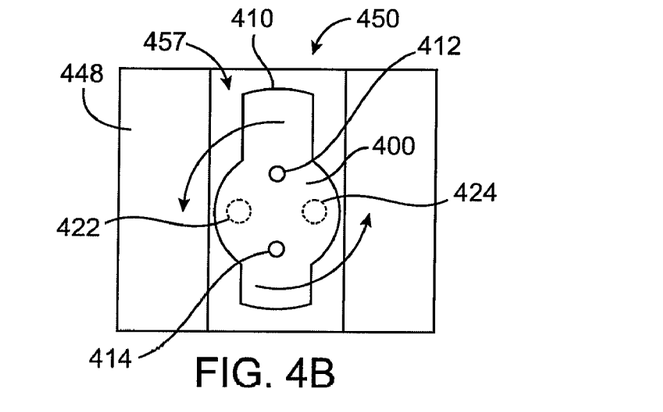
Figure 4C:
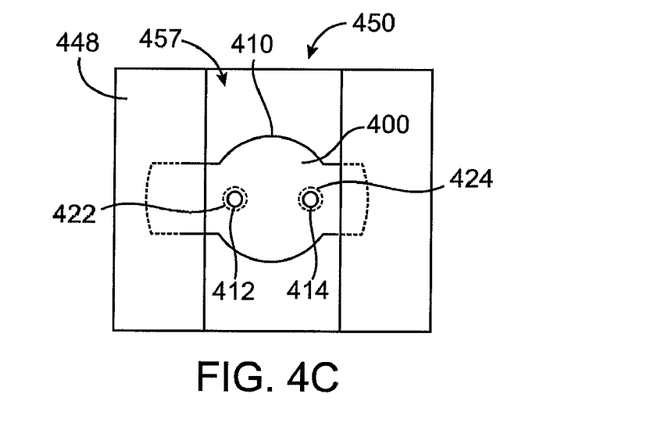

FIGS. 4A to 4C show installation of a quick turn connector 450 on a gas distributor into a gas supply line support according to an embodiment of the present invention. A support 448 includes a channel 422 to pass a first fluid and a channel 424 to pass a second fluid as described above. The quick turn connector connects the gas distributor to the support with no more than half a turn, for example with a quarter turn. Support 448 also includes a channel 457. A gas distributor 400 includes a channel 412 to pass a first fluid as described above and a second channel 414 to pass a second fluid as described above. Gas distributor 400 includes a long flange 410 and a short flange 411. Gas distributor 400 is positioned in a first orientation to align flange 410 and flange 411 along channel 457. Channel 457 receives the flanges of gas distributor 400 as shown by arrow 458. As shown in FIG. 4B, flanges 410 and 411 are inserted into channel 457. As shown in FIG. 4C gas distributor 400 is rotated 90 degrees to the predetermined orientation so that flanges 410 and 411 engage the wide and narrow channels adapted to receive and mate with the flanges as described above. As shown in FIG. 4C gas distributor 400 is aligned with support 448 in the predetermined angular orientation so that channels 412 and 414 are aligned with channels 422 and 424, respectively, to pass the first and second fluids, respectively, as described above.

Figure 5:
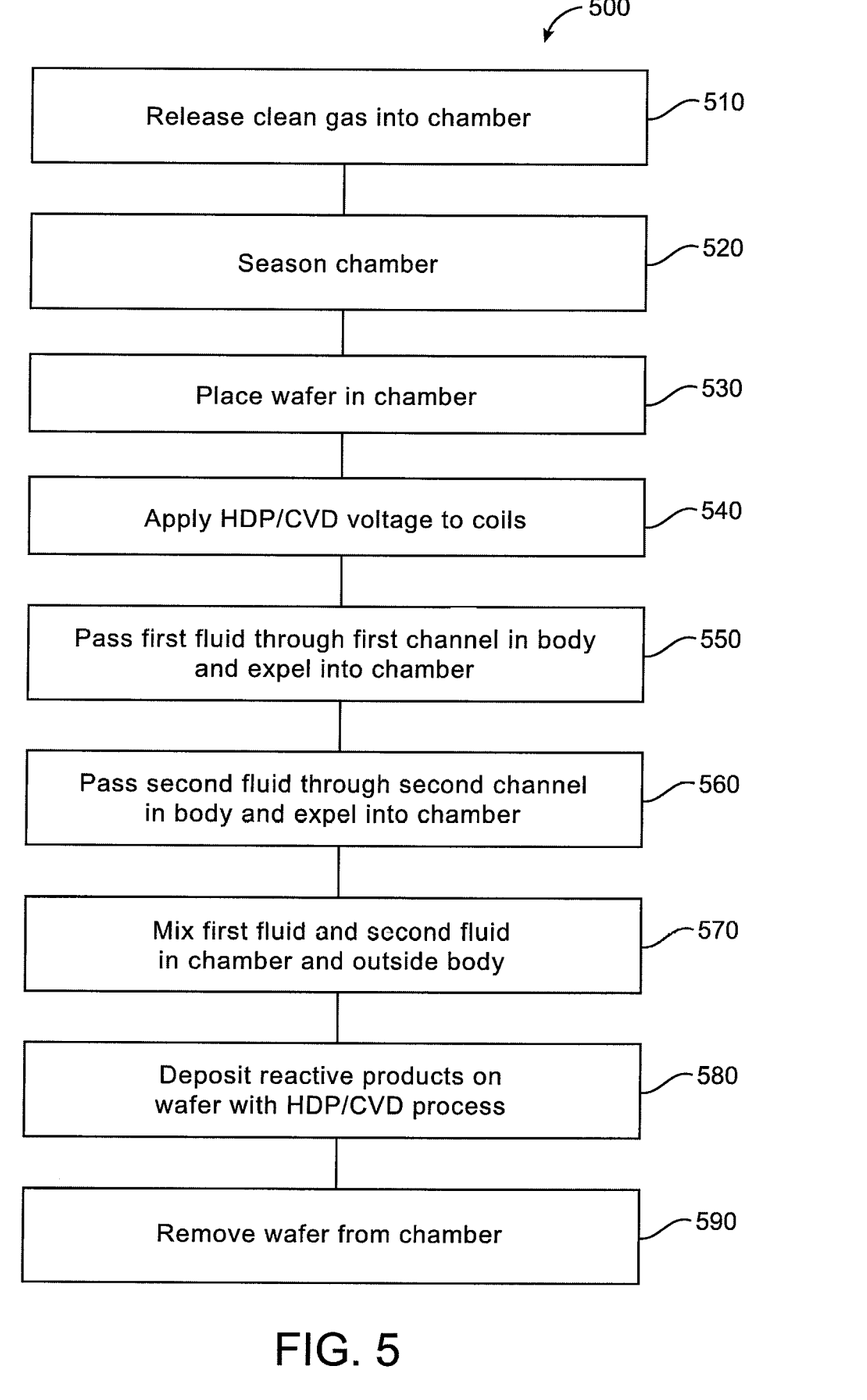
FIG. 5 shows a method of processing a wafer with a gas distributor having two channels formed therein according to an embodiment of the present invention.

FIG. 5 shows a method 500 of processing a wafer with a gas distributor having two channels formed therein according to an embodiment of the present invention. A step 510 releases a clean gas into the chamber to clean the chamber. A step 520 seasons the chamber with a deposition gas to prevent contamination of the chamber. A step 530 places a semiconductor wafer in the chamber for processing. A step 540 applies an HDP/CVD voltage to the coils to generate plasma. A step 550 passes a first fluid through a first channel in the body of the gas distributor and expels the gas into the chamber. A step 560 passes a second fluid through a second channel in the gas distributor and expels the second fluid into the chamber. A step 570 mixes the first fluid and the second fluid in the chamber outside the body of the gas distributor. A step 580 deposits reactive products on the wafer with HDP/CVD process. A step 590 removes the semiconductor wafer from the chamber. It should be noted that many of the steps shown in FIG. 5 are performed at the same time or substantially the same time so that at least a portion of each step is performed while at least a portion of another step is performed. For example, HDP voltage is applied to the coils with step 540, while the first fluid passes through the first channel with step 550 and the second fluid passes through the second channel with step 560 and reactive products are deposited on the wafer with step 580.

It should be appreciated that the specific steps illustrated in FIG. 5 provide a particular method of processing a wafer according to an embodiment of the present invention. Other sequences of steps may also be performed according to alternative embodiments. For example, alternative embodiments of the present invention may perform the steps outlined above in a different order. Also, many of the steps may be performed at the same time and at least partially overlap with respect to timing of the steps. Moreover, the individual steps illustrated in FIG. 5 may include multiple sub-steps that may be performed in various sequences as appropriate to the individual step. Furthermore, additional steps may be added or removed depending on the particular applications. One of ordinary skill in the art will recognize many variations, modifications, and alternatives.

Figure 6A:
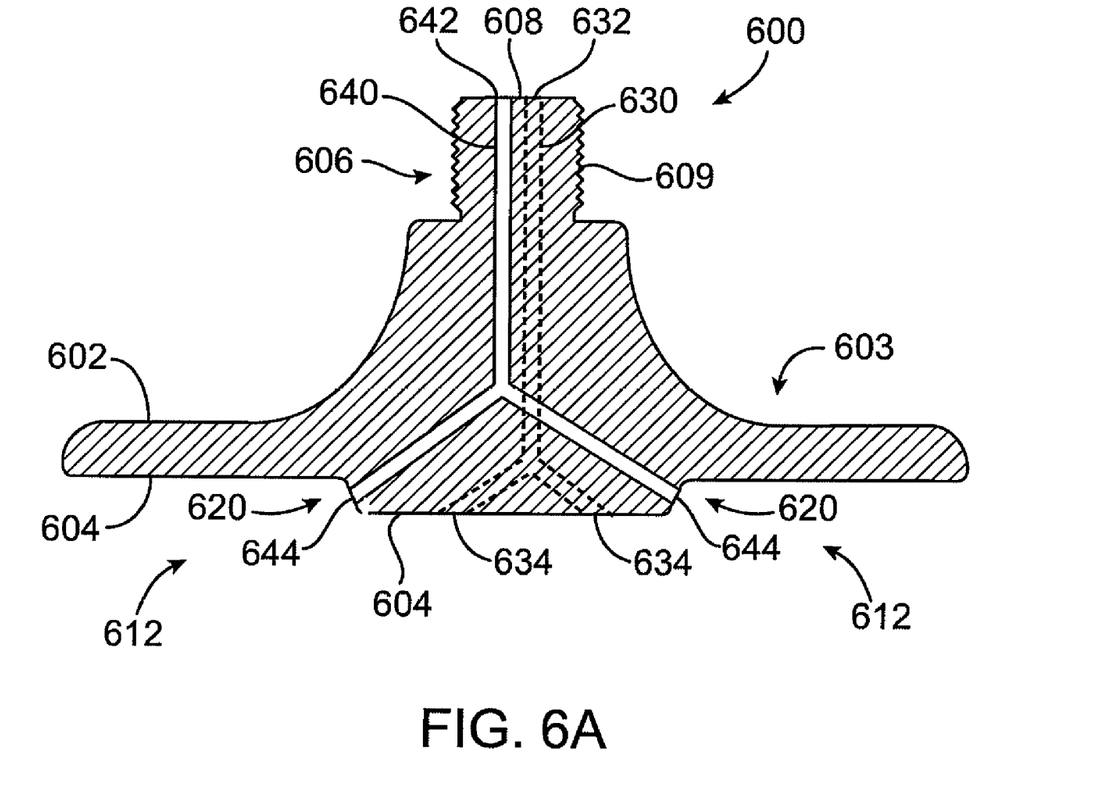
FIG. 6A shows a gas distributor with a first channel that comprises several branches that extend to a plurality of first openings and a second channel with several branches that extend to a plurality of second openings according to an embodiment of the present invention.

FIG. 6A shows cross sectional view of a gas distributor 600 with a first channel that comprises several branches that extend to a plurality of first openings and a second channel with several branches that extend to a plurality of second openings according to an embodiment of the present invention. Gas distributor 600 has two channels formed therein to separately pass a first fluid and a second fluid. Gas distributor 600 includes an upper end 608 located near a neck 606 that supports the gas distributor. Neck 606 includes threads adapted to attach the gas distributor to a support connected to fluid supply lines, for example gas delivery lines as described above, and has a first diameter. In an alternate embodiment, the gas distributor includes a quick turn connector as described above. Gas distributor 600 includes an upper surface 602, or concave surface, and a baffle 603. Baffle 603 includes upper surface 602 that is shaped to deflect a clean gas toward the chamber wall. A lateral seat is disposed between neck 606 and upper surface 602. Gas distributor 600 includes a lower surface 604. Lower surface 604 is disposed opposite to upper surface 602. Lower surface 604 includes a gas distribution surface 612 that is shaped to evenly distribute deposition gases on the substrate below. Lower surface 604 and gas distribution surface 612 include a step 620 to improve mixing of gasses in the chamber. Lower surface 604 includes a central flat portion and a recessed peripheral flat portion separated from the central flat portion by step. 620. The central flat portion extends radially from a center of lower surface 604 and has a second diameter greater than the first diameter of neck 606. Step 620 includes first openings 644, or outlets, formed thereon. Gas distributor 600 includes a first channel 640 adapted to pass a first fluid, for example a gas such as $SiH_4$. In alternate embodiments first channel 640 is adapted to pass a fluid that comprises a liquid. Channel 640 extends from an opening 642, or first inlet, at upper end 608 to first openings 644 formed in step 620. First openings 644 are disposed circumferentially around gas distribution surface 612 along step 620. Gas distributor 600 also includes a second channel 630 adapted to pass a second fluid, for example a gas such as $O_2$. In alternate embodiments second channel 630 is adapted to pass a fluid that comprises a liquid. Second channel 630 extends from an opening 632, or second inlet, formed in upper end 608 to second openings 634, or outlets, formed in lower surface 604. Gas distributor 600 is typically made from a single piece of material as described above.

Figure 6B:
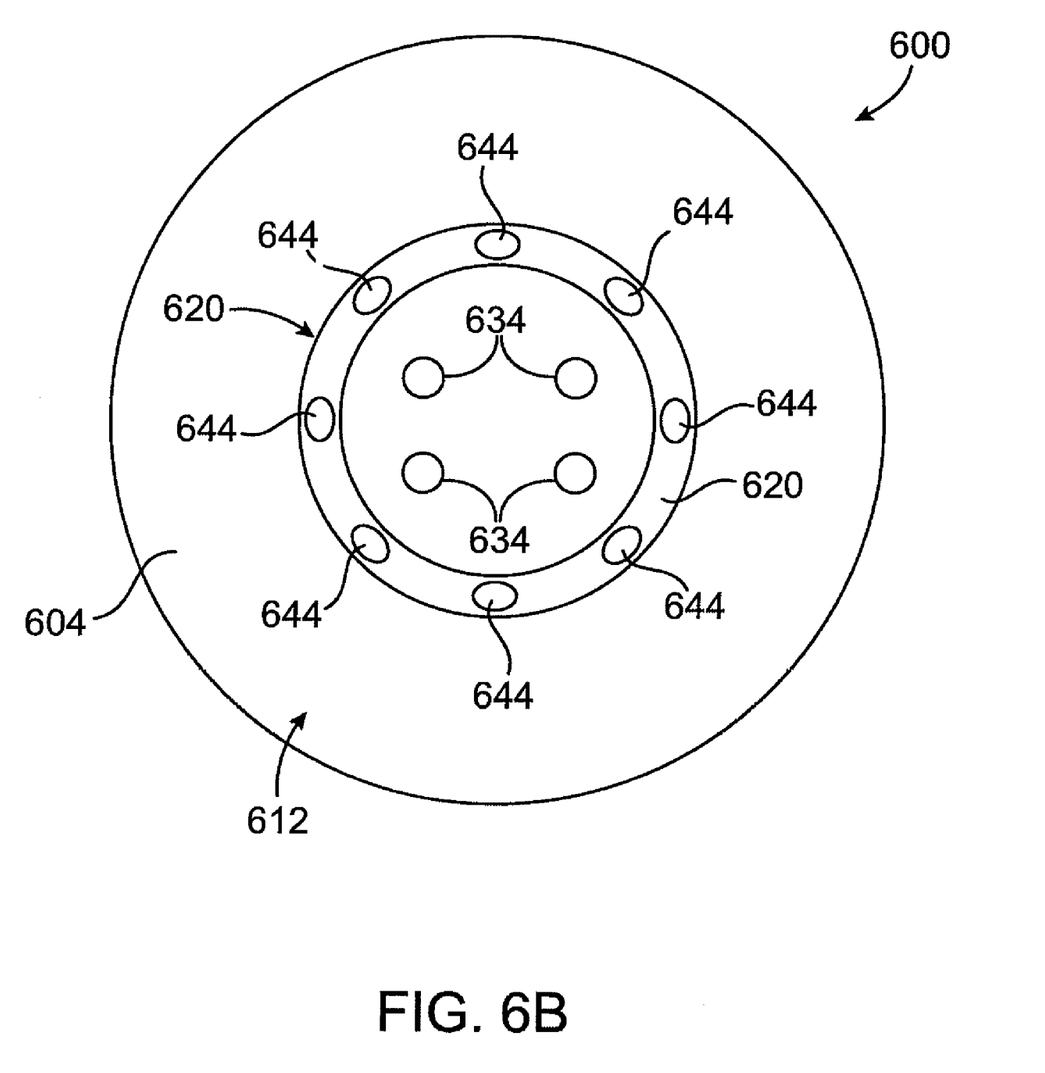
FIG. 6B shows a bottom view of the gas distributor as in FIG. 6A according to an embodiment of the present invention.
Figure 6C:
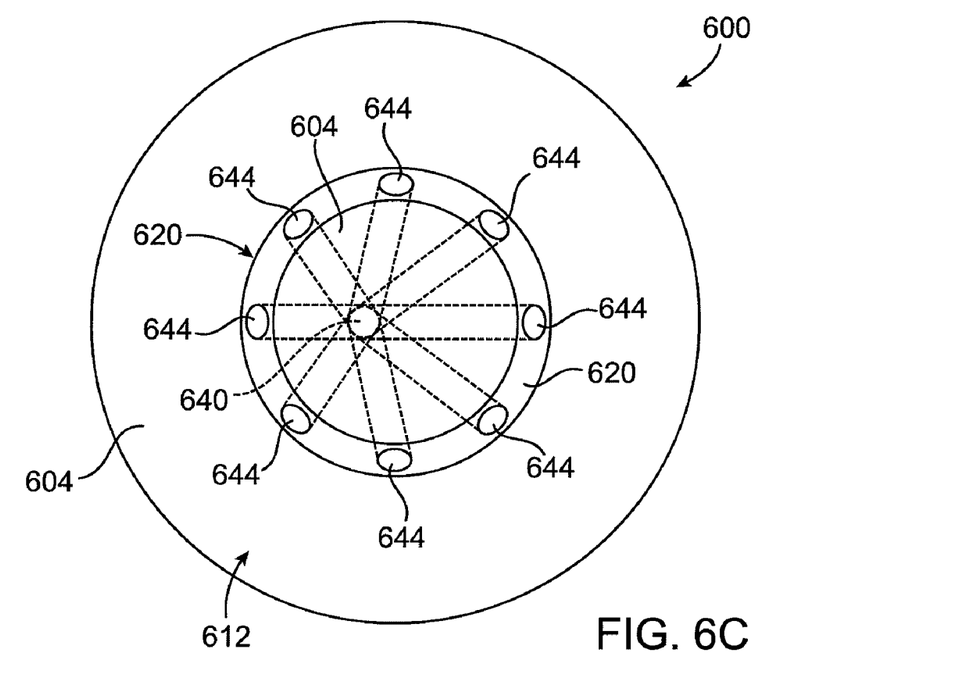
FIG. 6C illustrates a bottom view of the gas distributor as in FIGS. 6A and 6B and the first channel and the several branches that extend to the plurality of first openings according to an embodiment of the present invention.
Figure 6D:
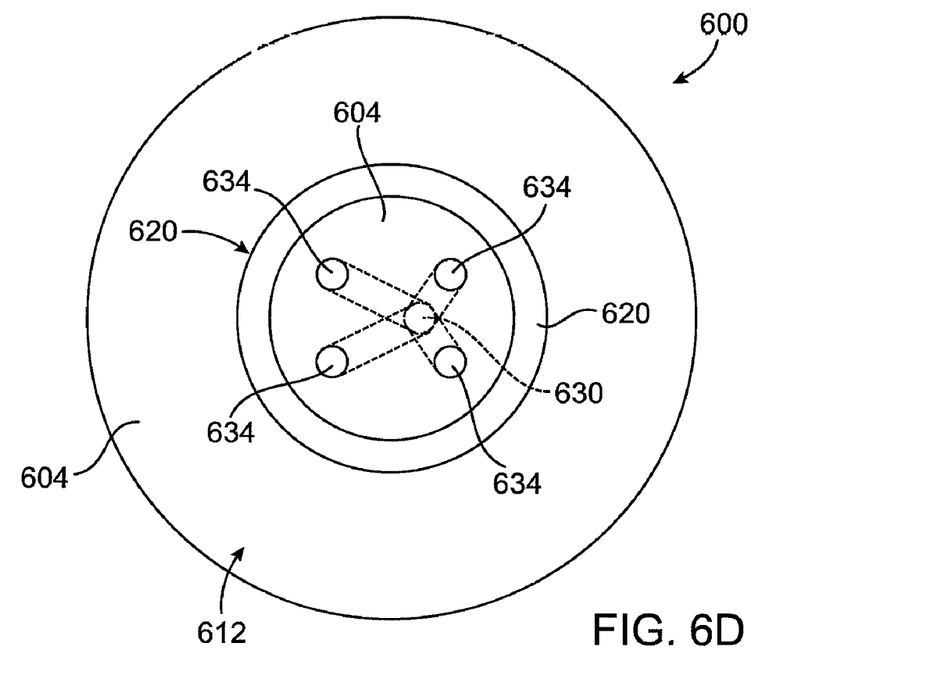
FIG. 6D illustrates a bottom view of the gas distributor as in FIGS. 6A and 6B and the second channel and the several branches that extend to the plurality of second openings according to an embodiment of the present invention.

FIG. 6B shows a bottom view of the gas distributor 600 as in FIG. 6A according to an embodiment of the present invention. Openings 644 include 8 openings disposed circumferentially around gas distribution surface 612 along step 620. While eight openings are shown, openings 644 can include a range from 2 to 16 openings, for example from 4 to 12 openings. Channel 640 includes as many branches as needed to connect opening 642 with openings 644, for example 8 branches. FIG. 6C shows eight branches of channel 640 extending to openings 644. Openings 634 are disposed near the center of gas distributor 600 and gas distribution surface 612. Openings 634 are disposed on the elevated central portion of lower surface 604. Channel 630 includes as many branches as needed to connect opening 632 with openings 634, for example 4 branches. FIG. 6D shows four branches of channel 630 extending to openings 634. As gas distributor 600 is positioned centrally in the chamber as described above, openings 634 are positioned centrally in the chamber above the substrate support and a central portion of substrate. While openings 634 are shown centrally in FIG. 6B, these openings can be disposed anywhere along lower surface 204, for example along the peripheral recessed portion of lower surface 604 outside step 620.

While the present invention has been described with respect to particular embodiments and specific examples thereof, it should be understood that other embodiments may fall within the spirit and scope of the invention. The scope of the invention should, therefore, be determined with reference to the appended claims along with their full scope of equivalents.

What is claimed is:

1. A gas distributor for use in a semiconductor process chamber comprising a support, the gas distributor comprising:
    a body including:
        a neck having a first diameter,
        an upper end adjacent to the neck,
        a first channel extending from a first inlet disposed on the upper end to at least a first opening disposed on a lower surface of the body, the first channel adapted to pass a first fluid from a first fluid supply line in the support to at least the first opening,
        a second channel extending from a second inlet disposed on the upper end to at least a second opening disposed on the lower surface of the body, the second channel adapted to pass a second fluid from a second fluid supply line in the support to at least the second opening, wherein the body is generally rotationally symmetric about an axis extending along the body from the neck to a center of the lower surface of the body,
        a connector coupled to the neck and adapted to engage the support and hold the body in a predetermined rotational orientation about the axis such that the first channel is substantially aligned with the first fluid supply line and the second channel is substantially aligned with the second fluid supply line,
        a lateral seat extending outward from the neck,
        a concave surface extending from an outer periphery of the lateral seat outward and toward the lower surface of the body, and
        a baffle disposed between the concave surface and the lower surface of the body, wherein the lower surface of the body includes a central flat portion and a recessed peripheral flat portion separated from the central flat portion by a step, the first opening disposed on the step and the second opening disposed on the central flat portion, and wherein the central flat portion extends radially from the center of the lower surface of the body to the step and has a second diameter greater than the first diameter.

2. The gas distributor of claim 1 wherein the connector is adapted to connect the gas distributor to the support and seal the first channel to the first fluid supply line and the second channel to the second fluid supply line with no more than a half turn of the gas distributor relative to the support.

3. The gas distributor of claim 2 wherein the connector comprises structures adapted to engage the support and limit rotation of the gas distributor at the predetermined orientation.

4. The gas distributor of claim 2 wherein the connector is adapted to connect the gas distributor to the support and seal the first channel to the first fluid supply line and the second channel to the second fluid supply line with about a quarter turn of the gas distributor relative to the support.

5. The gas distributor of claim 1 wherein the connector comprises a first flange and a second flange and wherein the flanges are adapted to support the gas distributor.

6. The gas distributor of claim 5 wherein the support comprises a channel adapted to receive the first flange while the connector and the support are in a first orientation to insert the connector into the support, and wherein the flanges engage the support while the connector and the support are in the predetermined orientation.

7. The gas distributor of claim 6 wherein the flanges are adapted to engage the support with a quarter turn of the gas distributor from the first orientation to the predetermined orientation.

8. The gas distributor of claim 1 wherein the body is formed from a single piece of material.

* * * * *